(12) United States Patent
Li

(10) Patent No.: US 8,267,699 B2
(45) Date of Patent: Sep. 18, 2012

(54) BACKBOARD AND COMMUNICATION DEVICE

(75) Inventor: Bo Li, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 13/307,902

(22) Filed: Nov. 30, 2011

(65) Prior Publication Data

US 2012/0071034 A1   Mar. 22, 2012

Related U.S. Application Data

(63) Continuation of application No. PCT/CN2010/073331, filed on May 28, 2010.

(30) Foreign Application Priority Data

Jun. 12, 2009   (CN) .......................... 2009 1 0147979
Dec. 24, 2009  (CN) .......................... 2009 1 0215361

(51) Int. Cl.
*H01R 12/00*   (2006.01)

(52) U.S. Cl. ........................................................ 439/61

(58) Field of Classification Search ................... 439/61, 439/65, 541.5; 361/785, 788
See application file for complete search history.

(56) References Cited

U.S. PATENT DOCUMENTS

| | | | | |
|---|---|---|---|---|
| 4,686,608 A | * | 8/1987 | Hosking | 361/827 |
| 4,894,753 A | * | 1/1990 | Wadell et al. | 361/818 |
| 5,053,925 A | * | 10/1991 | Kitajima | 361/725 |
| 5,229,924 A | * | 7/1993 | Zell | 361/796 |
| 5,291,368 A | * | 3/1994 | Conroy-Wass | 361/796 |
| 5,666,271 A | * | 9/1997 | Kim et al. | 361/726 |
| 6,166,901 A | * | 12/2000 | Gamble et al. | 361/679.34 |
| 6,205,033 B1 | * | 3/2001 | Kelemen | 361/802 |
| 6,392,142 B1 | * | 5/2002 | Uzuka et al. | 174/541 |
| 6,438,309 B1 | * | 8/2002 | Franz | 385/135 |
| 6,452,805 B1 | * | 9/2002 | Franz et al. | 361/724 |
| 6,833,618 B2 | * | 12/2004 | Ono et al. | 257/726 |
| 7,099,160 B1 | * | 8/2006 | Ice | 361/802 |
| 7,167,380 B2 | * | 1/2007 | Ice | 361/796 |
| 7,285,975 B2 | * | 10/2007 | Kyung | 326/30 |
| 7,340,538 B2 | * | 3/2008 | Alappat et al. | 710/5 |

(Continued)

FOREIGN PATENT DOCUMENTS

CN        1166065 A       11/1997

(Continued)

OTHER PUBLICATIONS

International Search Report dated Sep. 2, 2010 in connection with International Patent Application No. PCT/CN2010/073331.

*Primary Examiner* — Amy Cohen Johnson
*Assistant Examiner* — Vladimir Imas

(57) ABSTRACT

A backboard is disclosed according to the embodiments of the present invention. Sockets for connecting at least two sub-racks are respectively disposed at two sides of the backboard, and the sockets include first sockets for splicing a first type of sub-cards and second sockets for splicing a second type of sub-cards. Connectors, the number of which is not smaller than that of the second sockets, are disposed at the first sockets, and connectors, the number of which is not smaller than that of the first sockets, are disposed at the second sockets. One of the connectors at the first sockets is connected to one of the connectors at each of the second sockets, and one of the connectors at the second sockets is connected to one of the connectors at each of the first sockets.

19 Claims, 6 Drawing Sheets

U.S. PATENT DOCUMENTS

| | | | |
|---|---|---|---|
| 7,411,806 B2 * | 8/2008 | Funaba et al. | 365/63 |
| 7,710,731 B2 * | 5/2010 | McClure et al. | 361/727 |
| 7,978,476 B2 * | 7/2011 | Heard et al. | 361/752 |
| 8,090,973 B2 * | 1/2012 | Bennett | 713/503 |
| 2004/0224550 A1 * | 11/2004 | Fujioka | 439/378 |
| 2005/0125575 A1 * | 6/2005 | Alappat et al. | 710/41 |
| 2012/0042489 A1 * | 2/2012 | Cai | 27/35 |

FOREIGN PATENT DOCUMENTS

CN            201181990 Y      1/2009

* cited by examiner

BACKBOARD AND COMMUNICATION DEVICE

CROSS-REFERENCE TO RELATED APPLICATIONS

This application is a continuation of International Application No. PCT/CN2010/073331, filed on May 28, 2010, which claims priority to Chinese Patent Application No. 200910215361.7, filed on Dec. 24, 2009, which claims priority to Chinese Patent Application No. 200910147979.4, filed on Jun. 12, 2009, all of which are hereby incorporated by reference in their entireties.

TECHNICAL FIELD

The present invention relates to the field of communications, and in particular, to a backboard and a communication device.

BACKGROUND

A communication device includes three main components: a service board, a backboard, and a switchboard. Signal communication between the service board and the switchboard is implemented through the backboard. FIG. 1 is a schematic view of connection of an orthogonal backboard system. As shown in FIG. 1, the service board and the backboard are connected through signal connectors, where the access capacity of the service board depends on the density of physical interfaces of the signal connectors; and the switchboard and the backboard are connected through signal connectors, where the switch capacity of the switchboard depends on the density of physical interfaces of the signal connectors. Due to the limit of the physical size of the service board and the switchboard, the number of the physical interfaces of the signal connectors for the service board and the switchboard cannot be increased unlimitedly. Therefore, if the access capacity and the switch capacity of the system are intended to be increased, the number of the service board and the switchboard must be increased in the system.

In the implementation of the present invention, the inventor finds that the prior art at least has the following problems.

As the number of slots is increased in the horizontal direction, the height of the backboard is increased accordingly. However, due to the restriction of the manufacturing capability of the printed circuit board (PCB), the height of the backboard cannot be increased unlimitedly, so as to limit the capacity of the service board.

SUMMARY

The embodiments of the present invention provide a backboard and a communication device, so as to expand the access capacity and the switch capacity of the communication device.

To achieve the above objectives, the embodiments of the present invention adopt the following technical solutions.

A backboard is provided, where sockets for connecting at least two sub-racks are respectively disposed at two sides of the backboard, and the sockets include first sockets for splicing a first type of sub-cards and second sockets for splicing a second type of sub-cards; connectors, the number of which is not smaller than that of the second sockets, are disposed at the first sockets, and connectors, the number of which is not smaller than that of the first sockets, are disposed at the second sockets; one of the connectors at the first sockets is connected to one of the connectors at each of the second sockets, and one of the connectors at the second sockets is connected to one of the connectors at each of the first sockets; the connectors include orthogonal connectors, at least one of the first sockets at one side of the backboard and at least one of the second sockets at the other side of the backboard are in a cross state, the orthogonal connectors are disposed at cross points of the first sockets and the second sockets on the backboard, and the first type of sub-cards spliced on the first sockets and the second type of sub-cards spliced on the second sockets are connected through the orthogonal connectors on the backboard.

A sub-rack assembly is provided, where the sub-rack assembly includes a backboard and at least two sub-racks disposed at two sides of the backboard, sockets are respectively disposed at the two sides of the backboard, the sockets are located in the sub-racks, and the sockets include first sockets for splicing a first type of sub-cards and second sockets for splicing a second type of sub-cards; connectors, the number of which is not smaller than that of the second sockets, are disposed at the first sockets, and connectors, the number of which is not smaller than that of the first sockets, are disposed at the second sockets; one of the connectors at the first sockets is connected to one of the connectors at each of the second sockets, and one of the connectors at the second sockets is connected to one of the connectors at each of the first sockets; the connectors include orthogonal connectors, at least one of the first sockets at one side of the backboard and at least one of the second sockets at the other side of the backboard are in a cross state, the orthogonal connectors are disposed at cross points of the first sockets and the second sockets on the backboard, and the first type of sub-cards spliced on the first sockets and the second type of sub-cards spliced on the second sockets are connected through the orthogonal connectors on the backboard.

A communication device is provided, where the communication device includes at least one sub-rack assembly, a first type of sub-cards, and a second type of sub-cards, the sub-rack assembly includes a backboard and at least two sub-racks disposed at two sides of the backboard, sockets are respectively disposed at the two sides of the backboard, the sockets are located in the sub-racks, and the sockets include first sockets for splicing a first type of sub-cards and second sockets for splicing a second type of sub-cards; connectors, the number of which is not smaller than that of the second sockets, are disposed at the first sockets, and connectors, the number of which is not smaller than that of the first sockets, are disposed at the second sockets; one of the connectors at the first sockets is connected to one of the connectors at each of the second sockets, and one of the connectors at the second sockets is connected to one of the connectors at each of the first sockets; the connectors include orthogonal connectors, at least one of the first sockets at one side of the backboard and at least one of the second sockets at the other side of the backboard are in a cross state, the orthogonal connectors are disposed at cross points of the first sockets and the second sockets on the backboard, and the first type of sub-cards spliced on the first sockets and the second type of sub-cards spliced on the second sockets are connected through the orthogonal connectors on the backboard.

The embodiments of the present invention provide a backboard and a communication device, so as to expand the backboard in the prior art. At least two sub-racks are disposed at each side of the backboard. Sockets for splicing sub-cards are disposed in the sub-racks. Service sub-cards and switch sub-cards spliced on the backboard can be connected through connectors disposed at the sockets. When the access capacity of the communication device needs to be increased, only the sub-racks for splicing the service sub-cards need to be added on the backboard, and the service sub-cards spliced on the added sub-racks can be connected to the switch sub-cards through the connectors disposed at the sockets. When the switch capacity of the communication device needs to be increased, only the sub-racks for splicing the switch sub-cards need to be added on the backboard, and the switch sub-cards spliced on the added sub-racks can be connected to the service sub-cards through the connectors disposed at the sockets. Moreover, the present invention maintains the probability for continuous expansion.

DETAILED DESCRIPTION

A backboard and a communication device provided by the embodiments of the present invention are described in detail in the following with reference to the accompanying drawings.

Embodiment 1

To expand the access capacity and the switch capacity of a communication device, an embodiment of the present invention provides a backboard.

Figure 1:
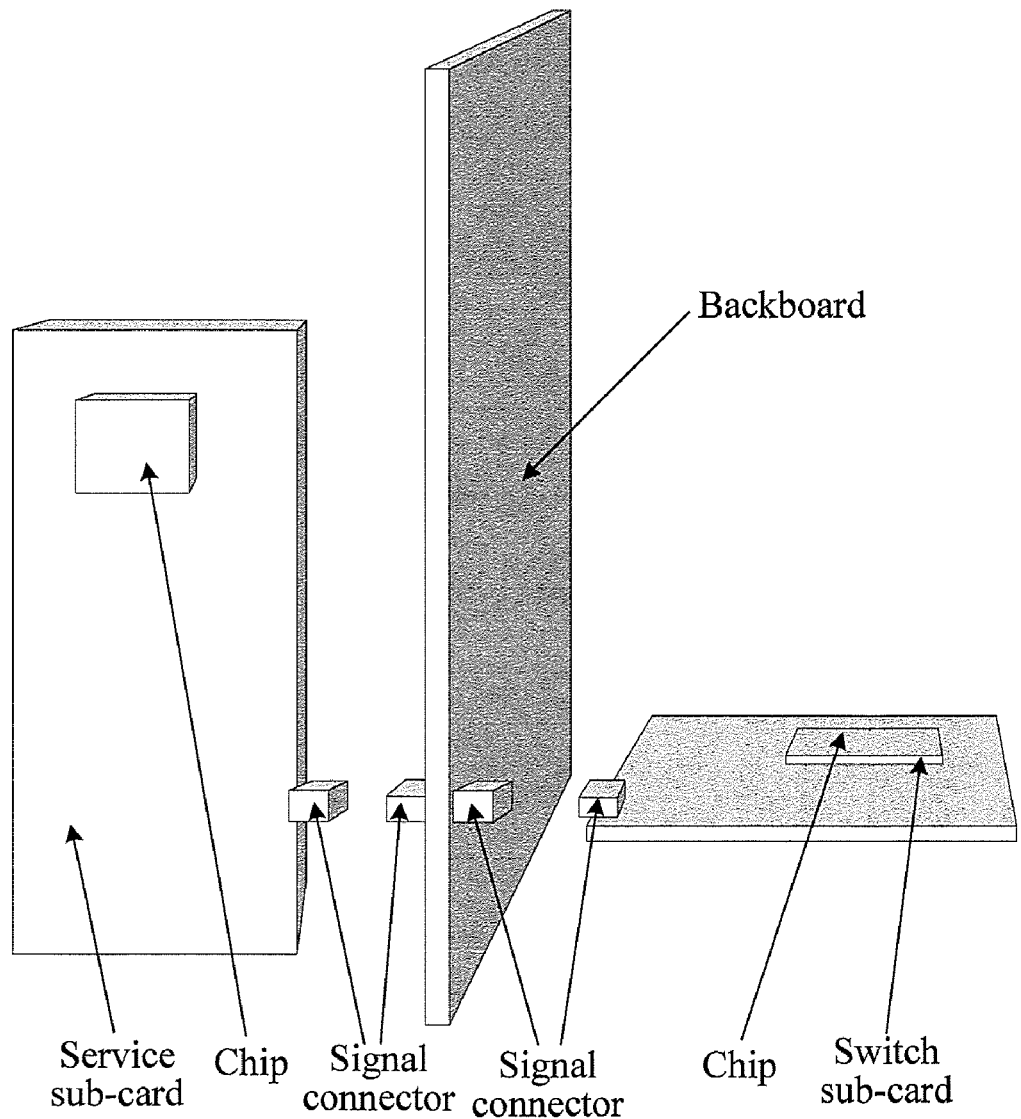
FIG. 1 is a schematic view of connection of an orthogonal backboard system in the prior art.
Figure 2:
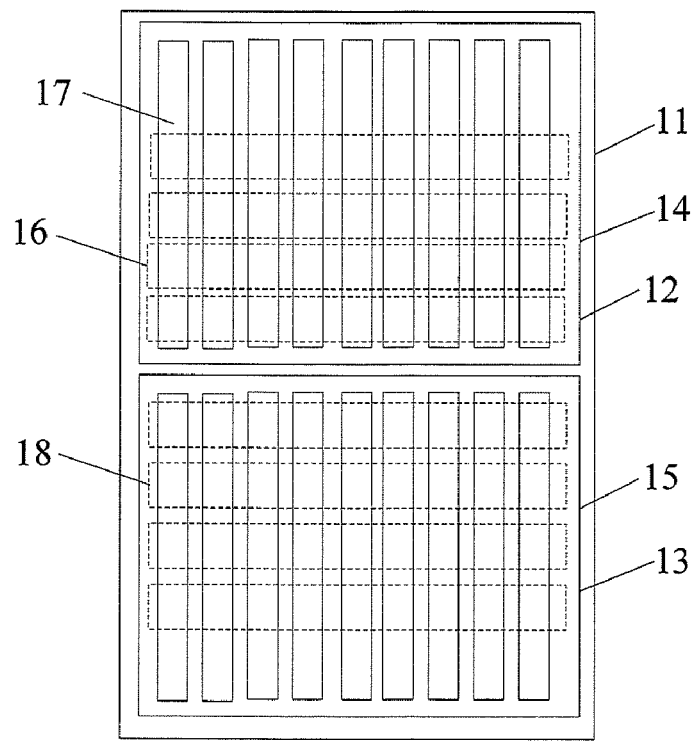
FIG. 2 is a schematic view of a backboard according to Embodiment 1 of the present invention.

The structures at two sides of the backboard are the same. For the convenience of description, the backboard is divided into a front side and a back side. As shown in FIG. 2, an upper sub-rack 12 and a lower sub-rack 13 are disposed at the front side of the backboard 11, and an upper sub-rack 14 and a lower sub-rack 15 are disposed at the back side of the backboard.

Sockets 16 are disposed in each sub-rack, and the sockets 16 include first sockets for splicing service sub-cards and second sockets for splicing switch sub-cards. The type of the sockets disposed in the same sub-rack of the backboard may be the same. As shown in FIG. 2, first sockets 17 for splicing a first type of sub-cards are disposed in the upper sub-rack 12 and the lower sub-rack 13 at the front side of the backboard, and second sockets 18 for splicing a second type of sub-cards are disposed in the upper sub-rack 14 and the lower sub-rack 15 at the back side of the backboard.

All the sockets in one sub-rack of the backboard may be parallel. For the convenience of maintenance, all the sockets at the same side of the backboard may also be parallel.

To ensure that each of the first type of sub-cards and each of the second type of sub-cards can be connected, connectors, the number of which is not smaller than that of the second sockets 18, are disposed at each of the first sockets 17, connectors, the number of which is not smaller than that of the first sockets 17, are disposed at each of the second sockets 18, one of the connectors at the first sockets 17 is connected to one of the connectors at each of the second sockets 18, and one of the connectors at the second sockets 18 is connected to one of the connectors at each of the first sockets 17. In the embodiment of the present invention, the number of the sockets disposed in one sub-rack is m, so the connectors, the number of which is not smaller than 2 m, are disposed at the first socket 17, and the connectors, the number of which is not smaller than 2 m, are disposed at the second socket 18.

In the actual application, to lower the cost, connectors, the number of which is equal to that of the second sockets 18, are disposed at each of the first sockets 17, and connectors, the number of which is equal to that of the first sockets 17, are disposed at each of the second sockets 18. In the embodiment of the present invention, 2 m connectors are disposed at each of the first sockets 17, and 2 m connectors are disposed at each of the second sockets 18.

The connectors include orthogonal connectors and non-orthogonal connectors. If the first sockets 17 disposed at one side of the backboard 11 and the second sockets 18 disposed at the other side of the backboard 11 are in a cross state, the orthogonal connectors are disposed at cross points of the backboard 11, and the two types of sub-cards spliced by the two types of sockets are connected through the orthogonal connectors on the backboard 11. If the first sockets 17 of the backboard 11 and the second sockets 18 of the backboard 11 are in a non-cross state, the two types of sub-cards spliced by the two types of sockets are connected through the non-orthogonal connectors on the backboard 11. The non-orthogonal connectors are connected through PCB wiring on the backboard 11. The cross state refers to the following situation. If the first sockets 17 at one side of the backboard 11 are projected onto a plane that is parallel to the backboard 11, and the second sockets 18 at the other side of the backboard 11 are projected onto the same plane, cross points exist between projections of the sockets. Projections of the orthogonal connectors on the plane are located at the cross points of the projections of the sockets, and projections of the non-orthogonal connectors are located at positions other than the cross points of the projections of the sockets.

In the embodiment of the present invention, the first type of sub-cards may be service sub-cards, and the second type of sub-cards maybe switch sub-cards. If the first sockets 17 in the upper sub-rack 12 at the front side of the backboard and the second sockets 18 in the upper sub-rack 14 at the back side of the backboard are in the cross state, and the first sockets 17 in the lower sub-rack 13 at the front side of the backboard and the second sockets 18 in the lower sub-rack 15 at the back side of the backboard are in the cross state, m orthogonal connectors and m non-orthogonal connectors are disposed at each of the first sockets 17, and m orthogonal connectors and m non-orthogonal connectors are disposed at each of the second sockets 18 of the backboard. Signal connection channels between the service sub-cards spliced in the upper sub-rack 12 at the front side of the backboard and the switch sub-cards spliced in the upper sub-rack 14 at the back side of the backboard are from chips of the service sub-cards in the upper sub-rack 12 at the front side of the backboard, to the orthogonal connectors of the service sub-cards in the upper sub-rack 12 at the front side of the backboard, to the orthogonal connectors at the first sockets 17 in the upper sub-rack at the front side of the backboard, to PCB through holes of the backboard, to the orthogonal connectors at the second sockets 18 in the upper sub-rack at the back side of the backboard, to the orthogonal connectors of the switch sub-cards in the upper sub-rack 14 at the back side of the backboard, to chips of the switch sub-cards in the upper sub-rack 14 at the back side of the backboard. Signal connection channels between the service sub-cards spliced in the lower sub-rack 13 at the front side of the backboard and the switch sub-cards spliced in the lower sub-rack 15 at the back side of the backboard are from chips of the service sub-cards in the lower sub-rack 13 at the front side of the backboard, to the orthogonal connectors of the service sub-cards in the lower sub-rack 13 at the front side of the backboard, to the orthogonal connectors at the first sockets 17 in the lower sub-rack at the front side of the backboard, to PCB through holes of the backboard, to the orthogonal connectors at the second sockets 18 in the lower sub-rack at the back side of the backboard, to the orthogonal connectors of the switch sub-cards in the lower sub-rack 15 at the back side of the backboard, to chips of the switch sub-cards in the lower sub-rack 15 at the back side of the backboard. Signal connection channels between the service sub-cards spliced in the lower sub-rack 13 at the front side of the backboard and the switch sub-cards spliced in the upper sub-rack 14 at the back side of the backboard are from chips of the service sub-cards in the lower sub-rack 13 at the front side of the backboard, to the non-orthogonal connectors of the service sub-cards in the lower sub-rack 13 at the front side of the backboard, to the non-orthogonal connectors at the first sockets 17 in the lower sub-rack at the front side of the backboard, to PCB wiring of the backboard, to the non-orthogonal connectors at the second sockets 18 in the upper sub-rack at the back side of the backboard, to the non-orthogonal connectors of the switch sub-cards in the upper sub-rack 14 at the back side of the backboard, to chips of the switch sub-cards in the upper sub-rack 14 at the back side of the backboard. Signal connection channels between the service sub-cards spliced in the upper sub-rack 12 at the front side of the backboard and the switch sub-cards in the lower sub-rack 15 at the back side of the backboard are from chips of the service sub-cards in the upper sub-rack 12 at the front side of the backboard, to the non-orthogonal connectors of the service sub-cards in the upper sub-rack 12 at the front side of the backboard, to the non-orthogonal connectors at the first sockets 17 in the upper sub-rack at the front side of the backboard, to PCB wiring of the backboard, to the non-orthogonal connectors at the second sockets 18 in the lower sub-rack at the back side of the backboard, to the non-orthogonal connectors of the switch sub-cards in the lower sub-rack 15 at the back side of the backboard, to chips of the switch sub-cards in the lower sub-rack 15 at the back side of the backboard.

All the orthogonal connectors of the service sub-cards and the switch sub-cards and the orthogonal connectors at the two sides of the backboard may be replaced with the non-orthogonal connectors, and the service sub-cards and the switch sub-cards are connected through the non-orthogonal connectors and the PCB wiring of the backboard. In this case, signal connection channels between the service sub-cards and the switch sub-cards at the two sides of the backboard are from chips of the service sub-cards at the front side of the backboard, to the non-orthogonal connectors of the service sub-cards at the front side of the backboard, to the non-orthogonal connectors at the front side of the backboard, to PCB wiring of the backboard, to the non-orthogonal connectors at the back side of the backboard, to the non-orthogonal connectors of the switch sub-cards at the back side of the backboard, to chips of the switch sub-cards at the back side of the backboard.

For the convenience of maintenance, in the embodiment of the present invention, if different types of sockets are disposed in corresponding positions at the two sides of the backboard, the first sockets 17 and the second sockets 18 are in the cross state, so different sub-cards spliced in the corresponding positions can be directly connected through the orthogonal connectors, thereby reducing the PCB wiring of the backboard. The different sockets in the corresponding positions at the two sides of the backboard may also be disposed perpendicular to each other, and the corresponding positions refer to that, the upper sub-rack at the front side of the backboard and the upper sub-rack at the back side of the backboard are at corresponding positions, and so on.

Figure 3:
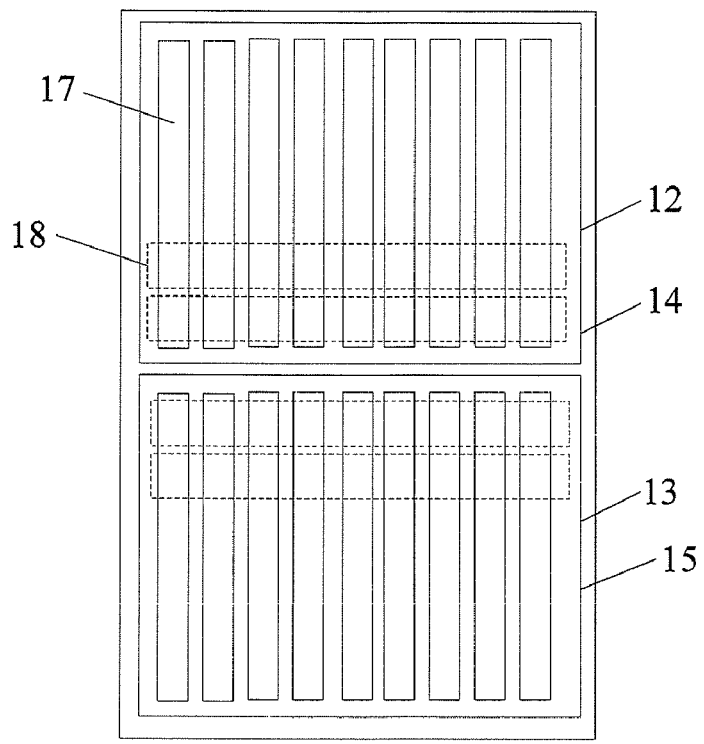
FIG. 3 is a schematic view of the backboard according to Embodiment 1 of the present invention.

As shown in FIG. 3, the first sockets 17 for splicing the first type of sub-cards are disposed in the upper sub-rack 12 and the lower sub-rack 13 at the front side of the backboard, and the second sockets 18 for splicing the second type of sub-cards are disposed in the upper sub-rack 14 and the lower sub-rack 15 at the back side of the backboard. Each side of the backboard is in the shape of a rectangle having long sides and short sides. The first sockets 17 are parallel to the long sides, and the second sockets 18 are parallel to the short sides. To reduce the PCB wiring on the backboard, the second sockets 18 are centralizedly disposed at the center of the back side of the backboard.

For the convenience of maintenance, in the embodiment of the present invention, only the first sockets 17 are disposed at the front side of the backboard, and only the second sockets 18 are disposed at the other side of the backboard. The first sockets 17 and the second sockets 18 may be both disposed in the same sub-rack.

In the embodiment of the present invention, the type of sub-cards spliced on the first sockets 17 may also be exchanged with the type of sub-cards spliced on the second sockets 18, that is, the switch sub-cards are spliced on the first sockets 17 and the service sub-cards are spliced on the second sockets 18. For the specific implementation, the preceding method can be referred to.

The embodiment of the present invention provides a backboard which expands the backboard in the prior art. At least two sub-racks are disposed at each side of the backboard. Sockets for splicing sub-cards are disposed in the sub-racks. Service sub-cards and switch sub-cards spliced on the backboard can be connected through connectors disposed at the sockets. When the access capacity of the communication device needs to be increased, only the sub-racks for splicing the service sub-cards need to be added on the backboard, and the service sub-cards spliced on the added sub-racks can be connected to the switch sub-cards through the connectors disposed at the sockets. When the switch capacity of the communication device needs to be increased, only the sub-racks for splicing the switch sub-cards need to be added on the backboard, and the switch sub-cards spliced on the added sub-racks can be connected to the service sub-cards through the connectors disposed at the sockets. Moreover, the embodiment of the present invention maintains the probability for continuous expansion.

Embodiment 2

To expand the access capacity and the switch capacity of a communication device, an embodiment of the present invention provides a backboard.

Figure 4:
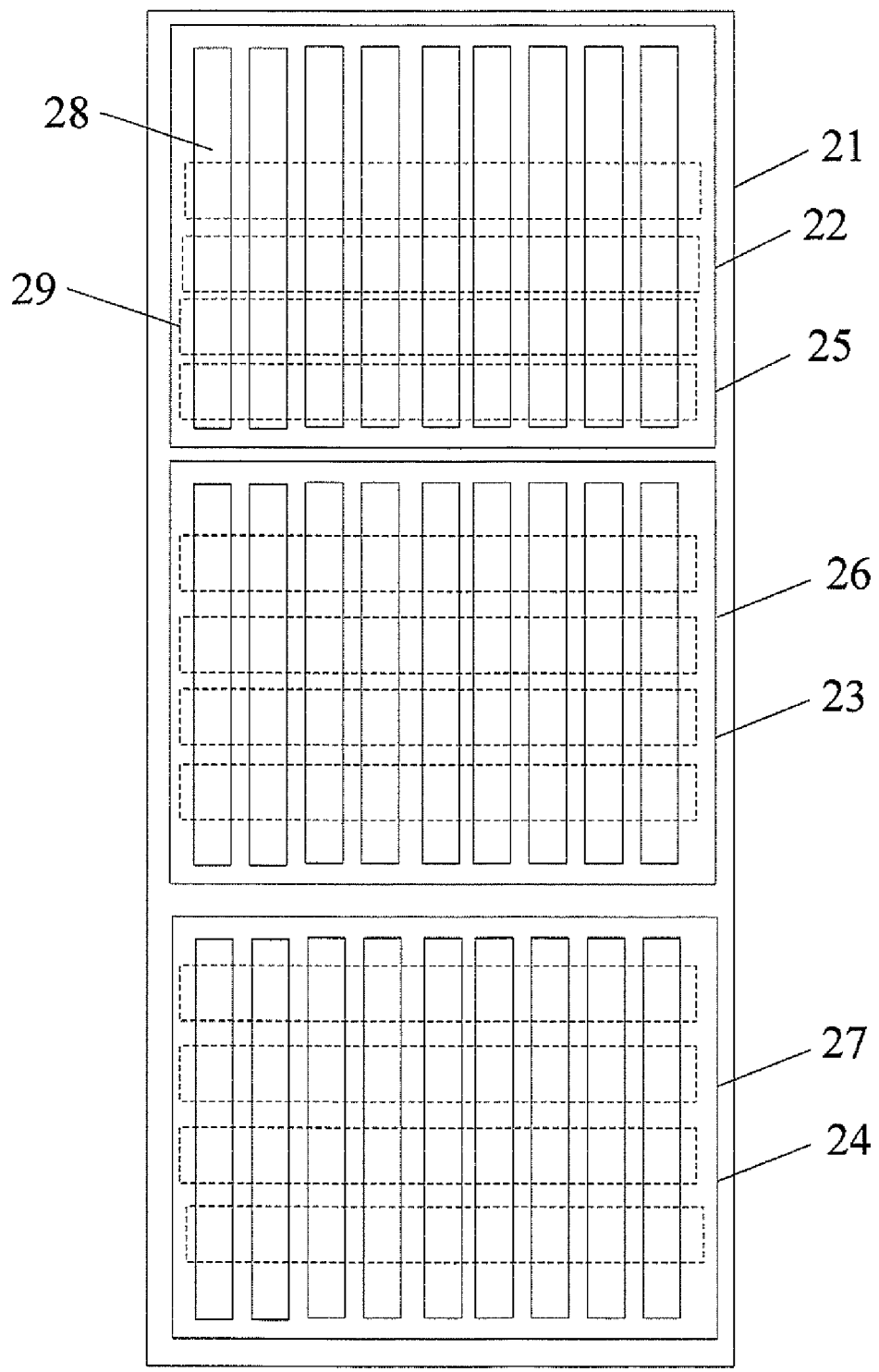
FIG. 4 is a schematic view of a backboard according to Embodiment 2 of the present invention.

The structures at two sides of the backboard are the same. For the convenience of description, the backboard is divided into a front side and a back side. As shown in FIG. 4, an upper sub-rack 22, a middle sub-rack 23, and a lower sub-rack 24 are disposed at the front side of the backboard 21, and an upper sub-rack 25, a middle sub-rack 26, and a lower sub-rack 27 are disposed at the back side of the backboard.

The type of sockets disposed in the same sub-rack of the backboard 21 may be the same. In the embodiment of the present invention, first sockets 28 for splicing a first type of sub-cards are disposed in the sub-racks at the front side of the backboard 21, and second sockets 29 for splicing a second type of sub-cards are disposed in the sub-racks at the back side of the backboard 21.

For the convenience of maintenance, all the sockets in the same sub-rack of the backboard 21 may be parallel, and all the sockets at the same side of the backboard 21 may also be parallel.

To ensure that each of the first type of sub-cards and each of the second type of sub-cards can be connected, connectors, the number of which is not smaller than that of the second sockets 29, are disposed at each of the first sockets 28, connectors, the number of which is not smaller than that of the first sockets 28, are disposed at each of the second sockets 29, one of the connectors at the first sockets 28 is connected to one of the connectors at each of the second sockets 29, and one of the connectors at the second sockets 29 is connected to one of the connectors at each of the first sockets 28. In the embodiment of the present invention, the number of the sockets disposed in one sub-rack is m, so the connectors, the number of which is not smaller than 3 m, are disposed at the first sockets 36, and the connectors, the number of which is not smaller than 3 m, are disposed at the second sockets 37.

In the actual application, to lower the cost, connectors, the number of which is equal to that of the second sockets 29, are disposed at each of the first sockets 28, and connectors, the number of which is equal to that of the first sockets 28, are disposed at each of the second sockets 29. In the embodiment of the present invention, 3 m connectors are disposed at each of the first sockets 28, and 3 m connectors are disposed at each of the second sockets 29.

The connectors include orthogonal connectors and non-orthogonal connectors. If the first sockets 28 disposed at one side of the backboard 21 and the second sockets 29 disposed at the other side of the backboard 21 are in a cross state, the orthogonal connectors are disposed at cross points of the backboard 21, and the two types of sub-cards spliced by the two types of sockets are connected through the orthogonal connectors on the backboard 21. If the first sockets 28 of the backboard 21 and the second sockets 29 of the backboard 21 are in a non-cross state, the two types of sub-cards spliced by the two types of sockets are connected through the non-orthogonal connectors on the backboard 21. The non-orthogonal connectors are connected through PCB wiring on the backboard 21. The cross state refers to the following situation. If the first sockets 28 at one side of the backboard 21 are projected onto a plane that is parallel to the backboard 21, and the second sockets 29 at the other side of the backboard 21 are projected onto the same plane, cross points exist between projections of the sockets. Projections of the orthogonal connectors on the plane are located at the cross points of the projections of the sockets, and projections of the non-orthogonal connectors are located at positions other than the cross points of the projections of the sockets.

In the embodiment of the present invention, the first type of sub-cards may be service sub-cards, and the second type of sub-cards may be switch sub-cards. If the first sockets 28 at the front side of the backboard and the second sockets 29 at the back side of the backboard are in the cross state, m orthogonal connectors and 2 m non-orthogonal connectors are disposed at each of the first sockets 28 in the sub-racks at the front side of the backboard, and m orthogonal connectors and 2 m non-orthogonal connectors are disposed at each of the second sockets 29 in the sub-racks at the back side of the backboard. Signal connection channels between the service sub-cards at the front side of the backboard and the switch sub-cards at corresponding positions at the back side of the backboard are from chips of the service sub-cards at the front side of the backboard, to the orthogonal connectors of the service sub-cards at the front side of the backboard, to the orthogonal connectors at the first sockets 28 at the front side of the backboard, to PCB through holes of the backboard, to the orthogonal connectors at the second sockets 29 at the back side of the backboard, to the orthogonal connectors of the switch sub-cards at the back side of the backboard, to chips of the switch sub-cards at the back side of the backboard. Signal connection channels between the service sub-cards in the sub-racks at the front side of the backboard and the switch sub-cards at non-corresponding positions in the sub-racks at the back side of the backboard are from chips of the service sub-cards at the front side of the backboard, to the non-orthogonal connectors of the service sub-cards at the front side of the backboard, to the non-orthogonal connectors at the first sockets 28 at the front side of the backboard, to PCB wiring of the backboard, to the non-orthogonal connectors at the second sockets 29 at the back side of the backboard, to the non-orthogonal connectors of the switch sub-cards at the back side of the backboard, to chips of the switch sub-cards at the back side of the backboard. Herein, the corresponding positions refer to that, the upper sub-rack 22 at the front side of the backboard and the upper sub-rack 25 at the back side of the backboard are at corresponding positions, and so on. The non-corresponding positions refer to that, the upper sub-rack 22 at the front side of the backboard and the middle sub-rack 26 at the back side of the backboard are at non-corresponding positions, and so on.

All the orthogonal connectors of the service sub-cards and the switch sub-cards and the orthogonal connectors at the two sides of the backboard 21 may be replaced with the non-orthogonal connectors, and the service sub-cards and the switch sub-cards are connected through the non-orthogonal connectors and the PCB wiring of the backboard. In this case, signal connection channels between the service sub-cards and the switch sub-cards at the two sides of the backboard 21 are from chips of the service sub-cards at the front side of the backboard, to the non-orthogonal connectors of the service sub-cards at the front side of the backboard, to the non-orthogonal connectors at the front side of the backboard, to PCB wiring of the backboard, to the non-orthogonal connectors at the back side of the backboard, to the non-orthogonal connectors of the switch sub-cards at the back side of the backboard, to chips of the switch sub-cards at the back side of the backboard.

For the convenience of maintenance, in the embodiment of the present invention, if different types of sockets are disposed in corresponding positions at the two sides of the backboard 21, the first sockets 28 and the second sockets 29 are in the cross state. In this way, different sub-cards spliced in the corresponding positions can be directly connected through the orthogonal connectors, and the PCB wiring of the backboard 21 is reduced. The different sockets in the corresponding positions at the two sides of the backboard 21 may also be disposed perpendicular to each other.

For the convenience of maintenance, in the embodiment of the present invention, only the first sockets 28 are disposed in the same sub-rack at the front side of the backboard 21, and only the second sockets 29 are disposed in the same sub-rack at the other side of the backboard 21. The first sockets 28 and the second sockets 29 may be both disposed in the same sub-rack of the backboard 21. In the embodiment of the present invention, the type of sub-cards spliced on the first sockets 28 may also be exchanged with the type of sub-cards spliced on the second sockets 29, that is, the switch sub-cards are spliced on the first sockets 28 and the service sub-cards are spliced on the second sockets 29. For the specific implementation, the preceding method can be referred to.

If the switch capacity and the access capacity of the communication device need to be further increased, more than three sub-racks may also be disposed at each side of the backboard, and sockets for splicing switch sub-cards and service sub-cards are disposed in each sub-rack.

The embodiment of the present invention provides a backboard which expands the backboard in the prior art. Three sub-racks are disposed at each side of the backboard. Sockets for splicing sub-cards are disposed in the sub-racks. Service sub-cards and switch sub-cards spliced on the backboard can be connected through connectors disposed at the sockets. When the access capacity of the communication device needs to be increased, only the sub-racks for splicing the service sub-cards need to be added on the backboard, and the service sub-cards spliced on the added sub-racks can be connected to the switch sub-cards through the connectors disposed at the sockets. When the switch capacity of the communication device needs to be increased, only the sub-racks for splicing the switch sub-cards need to be added on the backboard, and the switch sub-cards spliced on the added sub-racks can be connected to the service sub-cards through the connectors disposed at the sockets. Moreover, the embodiment of the present invention maintains the probability for continuous expansion.

To expand the access capacity and the switch capacity of a communication device, an embodiment of the present invention provides a communication device.

The communication device includes the backboard and the two types of sub-cards according to Embodiment 1 and Embodiment 2, where the two types of sub-cards may be switch sub-cards and service sub-cards. The service sub-cards are spliced on first sockets, and the switch sub-cards are spliced on second sockets. Alternatively, the service sub-cards may be spliced on the second sockets, and the switch sub-cards may be spliced on the first sockets.

Figure 5:
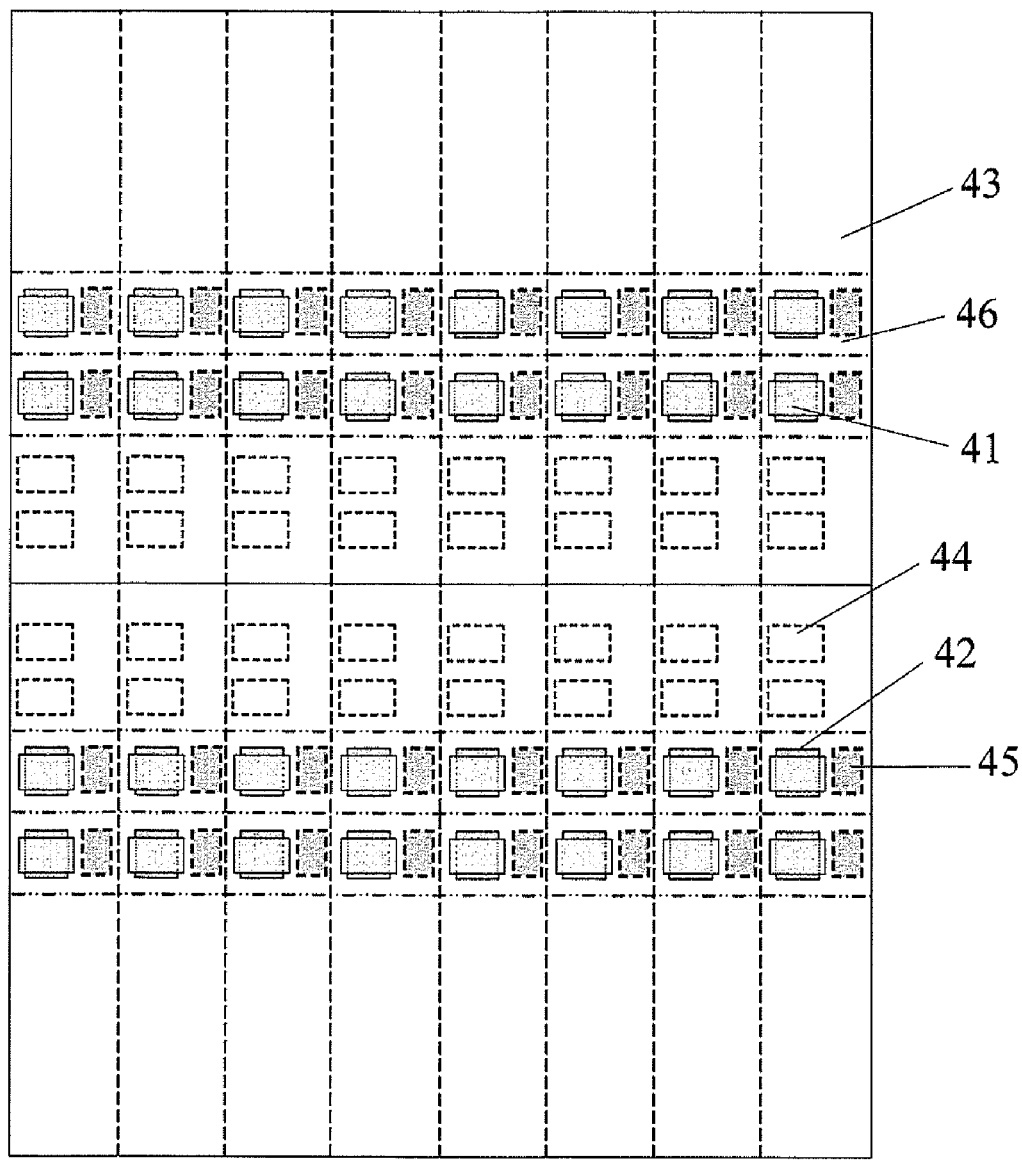
FIG. 5 is a schematic view of distribution of orthogonal connectors and non-orthogonal connectors on the backboard according to an embodiment of the present invention.

In Embodiment 1 and Embodiment 2, orthogonal connectors and non-orthogonal connectors on the backboard may be arranged in a manner as shown in FIG. 5.

Orthogonal connectors 41 at the front side of the backboard and orthogonal connectors 42 at the back side of the backboard are connected in a one-to-one corresponding manner. If the first sockets at one side of the backboard are projected onto a plane that is parallel to the backboard, and the second sockets at the other side of the backboard are projected onto the same plane, cross points exist between projections of the sockets. Projections of the orthogonal connectors 41 at the front side of the backboard are located at the cross points of the projections of the sockets, and projections of the orthogonal connectors 42 at the back side of the backboard are located at the cross points of the projections of the sockets. Two orthogonal connectors whose projections are located at the same cross point are in one-to-one correspondence. The two corresponding orthogonal connectors are directly connected via a PCB through hole on the backboard. Projections of the non-orthogonal connectors are located at positions other than the cross points of the projections of the sockets, and the non-orthogonal connectors are connected through PCB wiring on the backboard.

As shown in FIG. 5, on first sockets 43 at the front side of the backboard, the orthogonal connectors 41 are consecutively disposed, and then non-orthogonal connectors 44 are consecutively disposed. As the orthogonal connectors 42 at the back side of the backboard and the orthogonal connectors 41 at the front side of the backboard are connected in a one-to-one corresponding manner, accordingly, on second sockets 46 at the back side of the backboard, the orthogonal connectors 42 are consecutively disposed, and then non-orthogonal connectors 45 are consecutively disposed.

Figure 6:
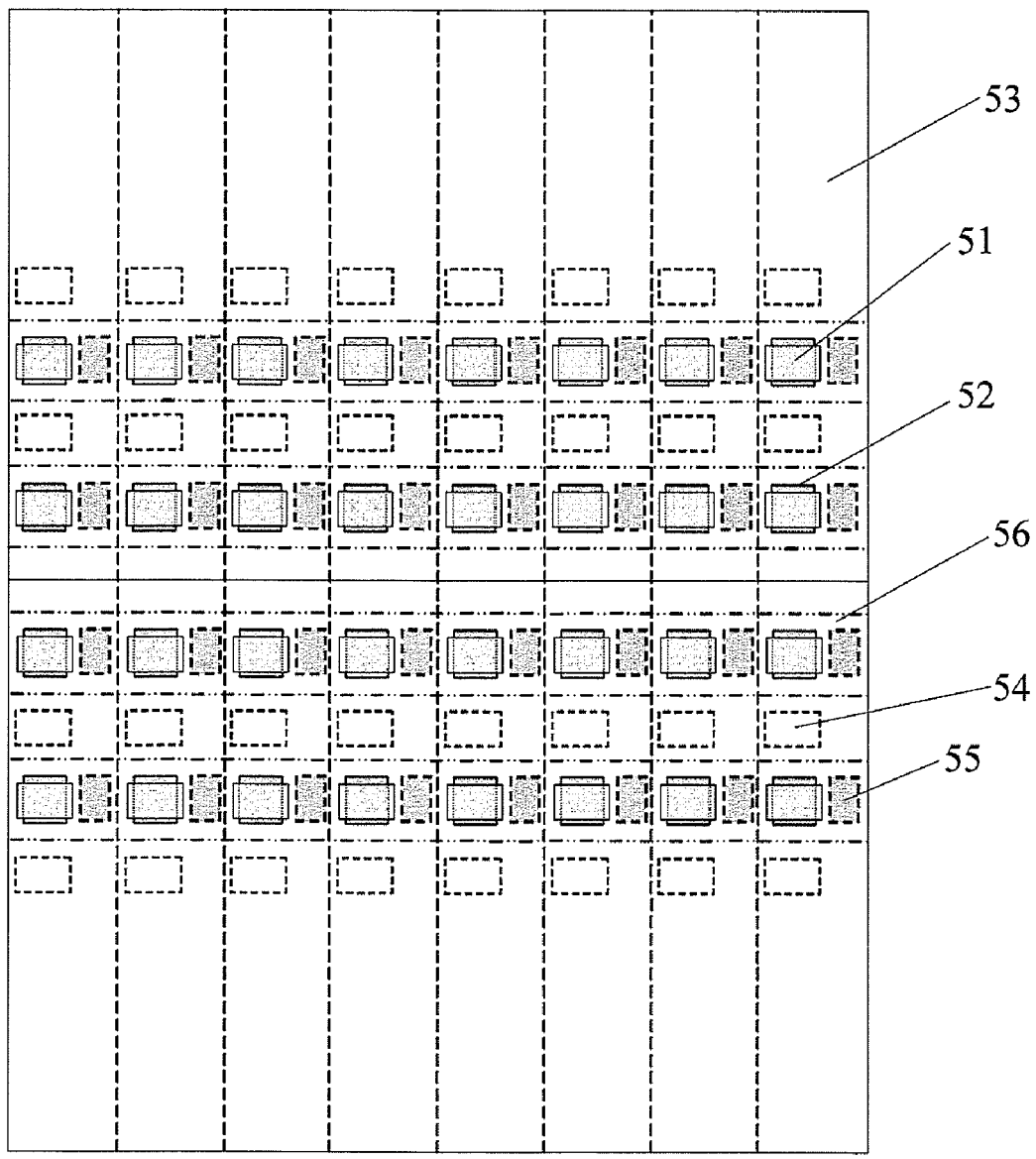
FIG. 6 is a schematic view of distribution of orthogonal connectors and non-orthogonal connectors on the backboard according to an embodiment of the present invention.

As shown in FIG. 6, orthogonal connectors 51 and non-orthogonal connector 54 are alternately disposed at first sockets 53 at the front side of the backboard. As the orthogonal connectors 52 at the back side of the backboard and the orthogonal connectors 51 at the front side of the backboard are connected in a one-to-one corresponding manner, accordingly, the orthogonal connectors 52 and non-orthogonal connectors 55 are alternately disposed on second sockets 56 at the back side of the backboard.

On the basis of FIG. 5 and FIG. 6, the positions of the orthogonal connectors and the positions of the non-orthogonal connectors in the sub-racks at the front side of the backboard may be exchanged in an up-and-down direction. As the orthogonal connectors at the back side of the backboard and the orthogonal connectors at the front side of the backboard are in one-to-one correspondence, accordingly, the positions of the orthogonal connectors and the positions of the non-orthogonal connectors at the back side of the backboard may be exchanged in a left-and-right direction.

Figure 7:
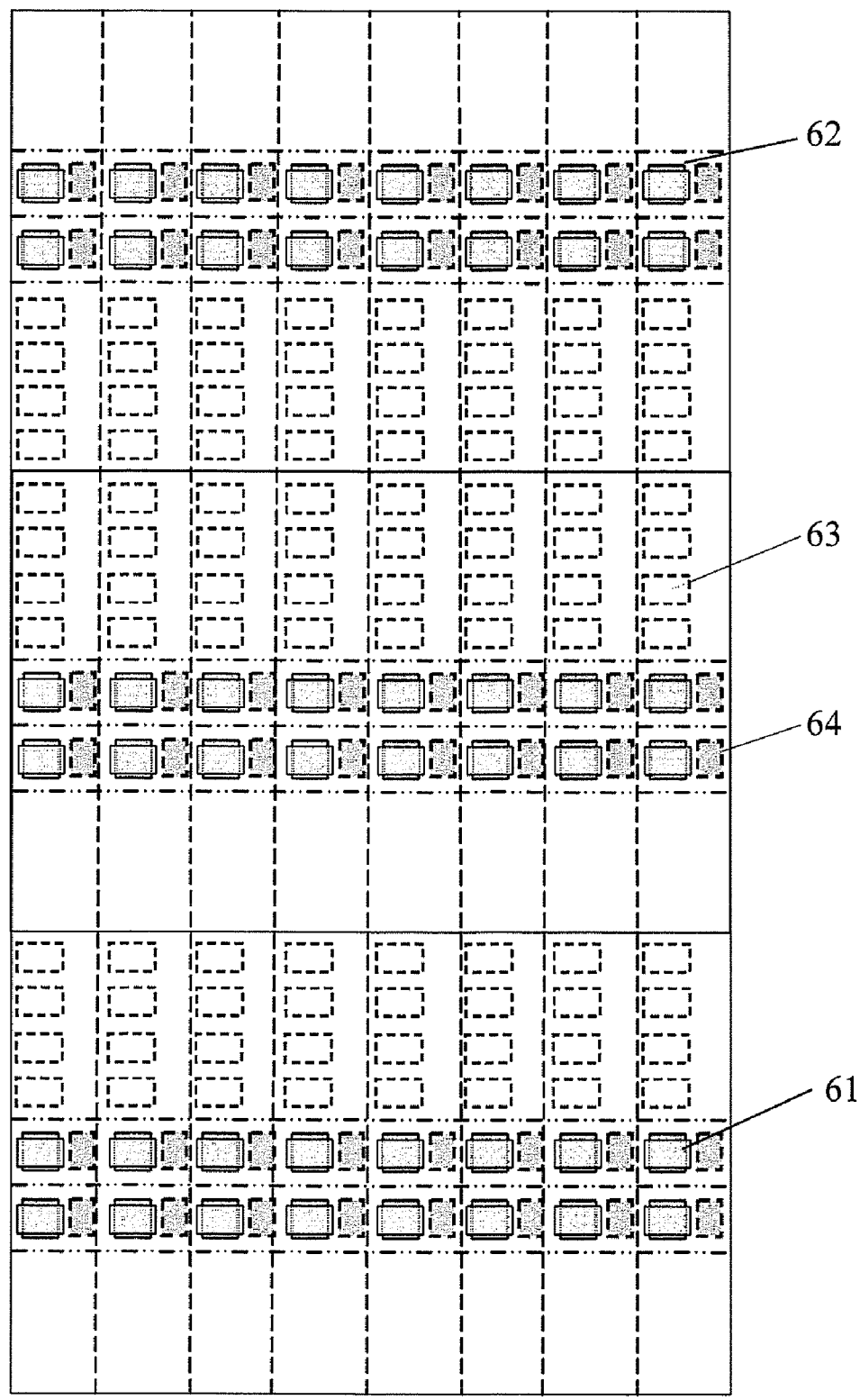
FIG. 7 is a schematic view of distribution of orthogonal connectors and non-orthogonal connectors on the backboard according to an embodiment of the present invention.

If the access capacity and the switch capacity of the communication device need to be further increased, the sub-racks can be added at the two sides of the backboard to achieve the purpose. Three sub-racks may be disposed at each side of the backboard. FIG. 7 is a schematic view of distribution of orthogonal connectors and non-orthogonal connectors at the front side and the back side of the backboard when three sub-racks are disposed at each side of the backboard. Referring to FIG. 7, the numeral 61 refers to an orthogonal connector at the front side of the backboard, the numeral 62 refers to an orthogonal connector at the back side of the backboard, the numeral 63 refers to a non-orthogonal connector at the front side of the backboard, and the numeral 64 refers to a non-orthogonal connector at the back side of the backboard.

The above are merely exemplary embodiments of the present invention. However, the protection scope of the present invention is not limited thereto. Changes or replacements readily derived by persons skilled in the prior art within the technical scope of the present invention shall fall within the protection scope of the present invention. Therefore, the protection scope of the present invention is subject to the appended claims.

What is claimed is:

1. A backboard, wherein sockets for connecting at least two sub-racks are respectively disposed at two sides of the backboard, and the sockets comprise first sockets for splicing a first type of sub-cards and second sockets for splicing a second type of sub-cards; connectors, the number of which is not smaller than that of the second sockets, are disposed at the first sockets, and connectors, the number of which is not smaller than that of the first sockets, are disposed at the second sockets; one of the connectors at the first sockets is connected to one of the connectors at each of the second sockets, and one of the connectors at the second sockets is connected to one of the connectors at each of the first sockets; and the connectors comprise orthogonal connectors, at least one of the first sockets at one side of the backboard and at least one of the second sockets at the other side of the backboard are in a cross state, the orthogonal connectors are disposed at cross points of the first sockets and the second sockets on the backboard, and the first type of sub-cards spliced on the first sockets and the second type of sub-cards spliced on the second sockets are connected through the orthogonal connectors on the backboard.

2. The backboard according to claim 1, wherein the connectors further comprise non-orthogonal connectors, and if at least one of the first sockets at one side of the backboard and at least one of the second sockets at the other side of the backboard are in a non-cross state, the first type of sub-cards spliced on the first sockets and the second type of sub-cards spliced on the second sockets are connected through the non-orthogonal connectors on the backboard.

3. The backboard according to claim 2, wherein the orthogonal connectors and the non-orthogonal connectors are consecutively disposed at the first sockets, or the orthogonal connectors and the non-orthogonal connectors are alternately disposed at the first sockets; and the orthogonal connectors and the non-orthogonal connectors are consecutively disposed at the second sockets, or the orthogonal connectors and the non-orthogonal connectors are alternately disposed at the second sockets.

4. The backboard according to claim 1, wherein the sockets at one side of the backboard and the sockets at the other side of the backboard are perpendicular to each other.

5. The backboard according to claim 1, wherein two rows of vertical sockets are disposed at one side of the backboard, two sets of horizontal sockets are disposed at the other side of the backboard, one row of the vertical sockets at one side of the backboard and one set of the horizontal sockets at the other side of the backboard are connected through the orthogonal connectors, and at the two rows of the vertical sockets, the orthogonal connectors connected to the two sets of the horizontal sockets are respectively located at the ends of the two rows of the vertical sockets, wherein the ends are close to each other.

6. The backboard according to claim 1, wherein the first type of sub-cards are service sub-cards, and the second type of sub-cards are switch sub-cards.

7. The backboard according to claim 6, wherein three sub-racks for splicing service sub-cards are disposed at one side of the backboard, or three sub-racks for splicing service sub-cards are disposed at the two sides of the backboard.

8. A sub-rack assembly, comprising a backboard and at least two sub-racks disposed at two sides of the backboard, wherein sockets are respectively disposed at the two sides of the backboard, the sockets are located in the sub-racks, and the sockets comprise first sockets for splicing a first type of sub-cards and second sockets for splicing a second type of sub-cards; connectors, the number of which is not smaller than that of the second sockets, are disposed at the first sockets, and connectors, the number of which is not smaller than that of the first sockets, are disposed at the second sockets; one of the connectors at the first sockets is connected to one of the connectors at each of the second sockets, and one of the connectors at the second sockets is connected to one of the connectors at each of the first sockets; and the connectors comprise orthogonal connectors, at least one of the first sockets at one side of the backboard and at least one of the second sockets at the other side of the backboard are in a cross state, the orthogonal connectors are disposed at cross points of the first sockets and the second sockets on the backboard, and the first type of sub-cards spliced on the first sockets and the second type of sub-cards spliced on the second sockets are connected through the orthogonal connectors on the backboard.

9. The sub-rack assembly according to claim 8, wherein the connectors further comprise non-orthogonal connectors, and if at least one of the first sockets at one side of the backboard and at least one of the second sockets at the other side of the backboard are in a non-cross state, the first type of sub-cards spliced on the first sockets and the second type of sub-cards spliced on the second sockets are connected through the non-orthogonal connectors on the backboard.

10. The sub-rack assembly according to claim 9, wherein the orthogonal connectors and the non-orthogonal connectors are consecutively disposed at the first sockets, or the orthogonal connectors and the non-orthogonal connectors are alternately disposed at the first sockets; and the orthogonal connectors and the non-orthogonal connectors are consecutively disposed at the second sockets, or the orthogonal connectors and the non-orthogonal connectors are alternately disposed at the second sockets.

11. The sub-rack assembly according to claim 8, wherein two rows of vertical sockets are disposed at one side of the backboard, two sets of horizontal sockets are disposed at the other side of the backboard, one row of the vertical sockets at one side of the backboard and one set of the horizontal sockets at the other side of the backboard are connected through the orthogonal connectors, and at the two rows of the vertical sockets, the orthogonal connectors connected to the two sets of the horizontal sockets are respectively located at the ends of the two rows of the vertical sockets, wherein the ends are close to each other.

12. The sub-rack assembly according to claim 8, wherein the first type of sub-cards are service sub-cards, and the second type of sub-cards are switch sub-cards.

13. The sub-rack assembly according to claim 12, wherein three sub-racks for splicing service sub-cards are disposed at one side of the backboard, or three sub-racks for splicing service sub-cards are disposed at the two sides of the backboard.

14. A communication device, comprising at least one sub-rack assembly, a first type of sub-cards, and a second type of sub-cards, wherein the sub-rack assembly comprises a backboard and at least two sub-racks disposed at two sides of the backboard, sockets are respectively disposed at the two sides of the backboard, the sockets are located in the sub-racks, and the sockets comprise first sockets for splicing a first type of sub-cards and second sockets for splicing a second type of sub-cards; connectors, the number of which is not smaller than that of the second sockets, are disposed at the first sockets, and connectors, the number of which is not smaller than that of the first sockets, are disposed at the second sockets; one of the connectors at the first sockets is connected to one of the connectors at each of the second sockets, and one of the connectors at the second sockets is connected to one of the connectors at each of the first sockets; and the connectors comprise orthogonal connectors, at least one of the first sockets at one side of the backboard and at least one of the second sockets at the other side of the backboard are in a cross state, the orthogonal connectors are disposed at cross points of the first sockets and the second sockets on the backboard, and the first type of sub-cards spliced on the first sockets and the second type of sub-cards spliced on the second sockets are connected through the orthogonal connectors on the backboard.

15. The communication device according to claim 14, wherein the connectors further comprise non-orthogonal connectors, and if at least one of the first sockets at one side of the backboard and at least one of the second sockets at the other side of the backboard are in a non-cross state, the first type of sub-cards spliced on the first sockets and the second type of sub-cards spliced on the second sockets are connected through the non-orthogonal connectors on the backboard.

16. The communication device according to claim 15, wherein the orthogonal connectors and the non-orthogonal connectors are consecutively disposed at the first sockets, or the orthogonal connectors and the non-orthogonal connectors are alternately disposed at the first sockets; and the orthogonal connectors and the non-orthogonal connectors are consecutively disposed at the second sockets, or the orthogonal connectors and the non-orthogonal connectors are alternately disposed at the second sockets.

17. The communication device according to claim 14, wherein two rows of vertical sockets are disposed at one side of the backboard, two sets of horizontal sockets are disposed at the other side of the backboard, one row of the vertical sockets at one side of the backboard and one set of the horizontal sockets at the other side of the backboard are connected through the orthogonal connectors, and at the two rows of the vertical sockets, the orthogonal connectors connected to the two sets of the horizontal sockets are respectively located at the ends of the two rows of the vertical sockets, wherein the ends are close to each other.

18. The communication device according to claim 14, wherein the first type of sub-cards are service sub-cards, and the second type of sub-cards are switch sub-cards.

19. The communication device according to claim 18, wherein three sub-racks for splicing service sub-cards are disposed at one side of the backboard, or three sub-racks for splicing service sub-cards are disposed at the two sides of the backboard.

* * * * *